United States Patent [19]
Ohsawa et al.

[11] Patent Number: 6,074,898
[45] Date of Patent: Jun. 13, 2000

[54] LEAD FRAME AND INTEGRATED CIRCUIT PACKAGE

[75] Inventors: Kenji Ohsawa; Makoto Ito, both of Kanagawa, Japan

[73] Assignee: Sony Corporation, Tokyo, Japan

[21] Appl. No.: 09/237,296

[22] Filed: Jan. 25, 1999

Related U.S. Application Data

[63] Continuation of application No. 08/714,307, Sep. 18, 1996, Pat. No. 5,886,399.

[51] Int. Cl.[7] .......................... H01L 21/44; H01L 21/48; H01L 21/50
[52] U.S. Cl. .......................... 438/123; 438/106; 438/121
[58] Field of Search ................................ 438/123, 121, 438/106

[56] References Cited

U.S. PATENT DOCUMENTS

| | | |
|---|---|---|
| 5,184,207 | 2/1993 | Cain . |
| 5,291,062 | 3/1994 | Higgins et al. . |
| 5,409,865 | 4/1995 | Karnezos . |
| 5,420,460 | 5/1995 | Massingill . |
| 5,477,080 | 12/1995 | Ishisaka et al. . |
| 5,583,378 | 12/1996 | Marrs et al. . |
| 5,633,533 | 5/1997 | Andros et al. . |
| 5,786,239 | 7/1998 | Ohsawa et al. .......................... 438/123 |
| 5,886,399 | 3/1999 | Ohsawa et al. .......................... 257/668 |

*Primary Examiner*—Kevin M. Picardat
*Assistant Examiner*—D. M. Collins
*Attorney, Agent, or Firm*—Hill & Simpson

[57] ABSTRACT

A lead frame includes a plurality of leads held by an insulative holding film and each formed of an inner lead portion for being bonded to a semiconductor chip and an outer lead portion, a pad portion formed at an end portion of the outer lead portion, an insulating film formed in a pattern so as to insulate the adjacent leads, a ground film formed on the pad portion and partially on the insulating film and having a wider area as compared with that of the pad portion, and a projecting electrode formed on the ground film.

15 Claims, 11 Drawing Sheets

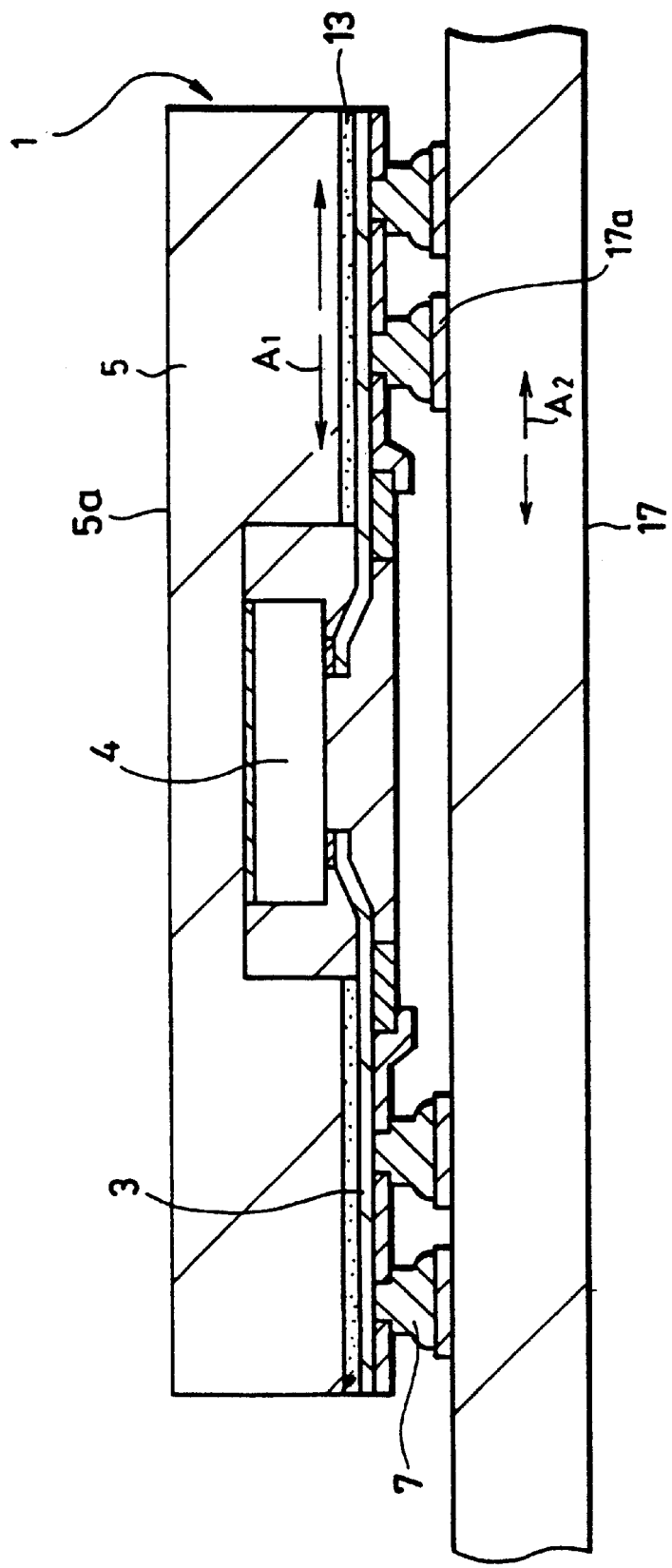

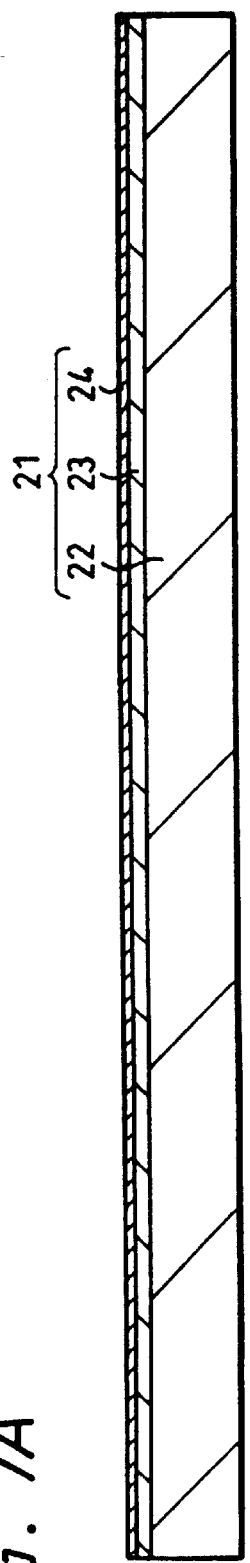
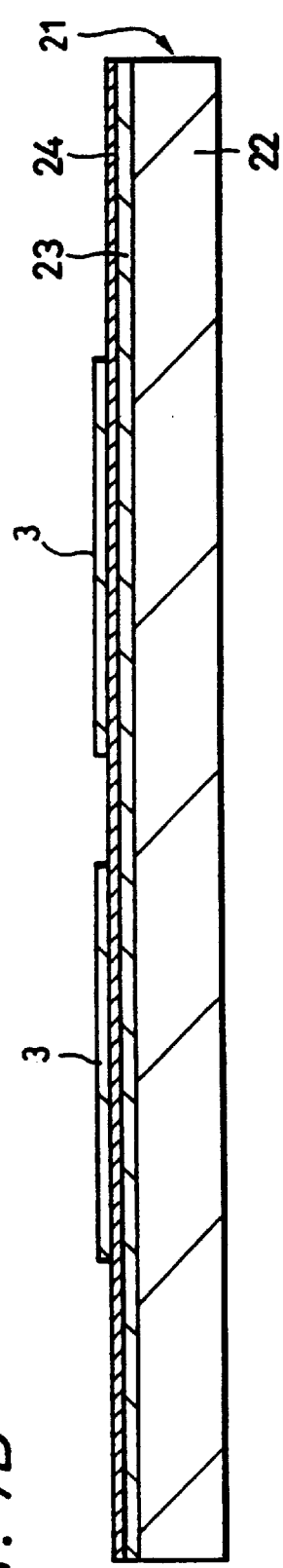
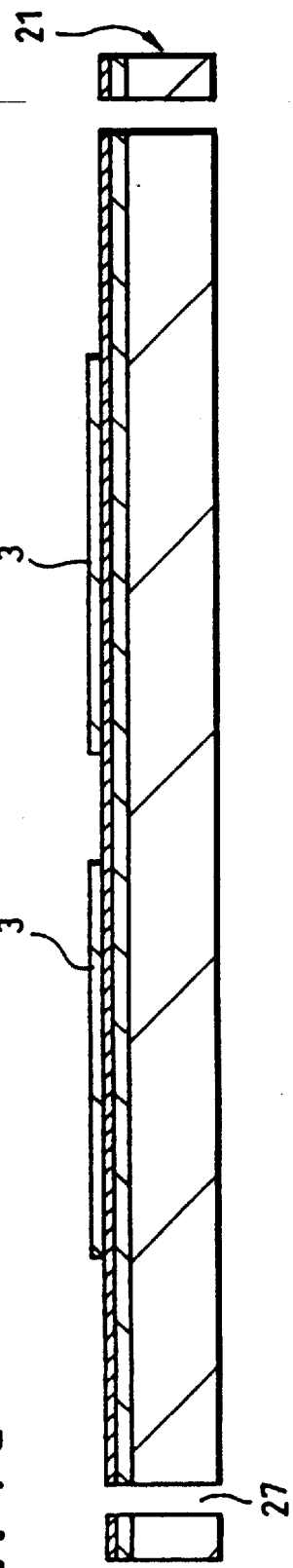
FIG. 7A
FIG. 7B
FIG. 7C

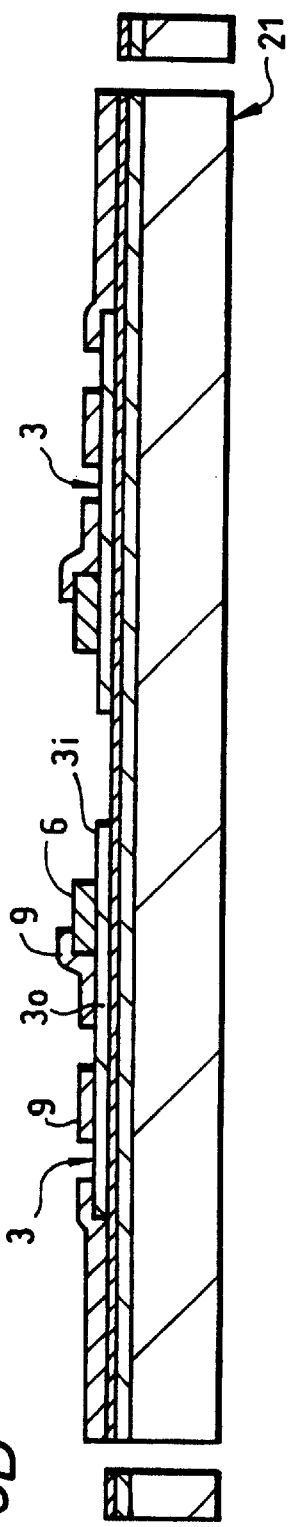
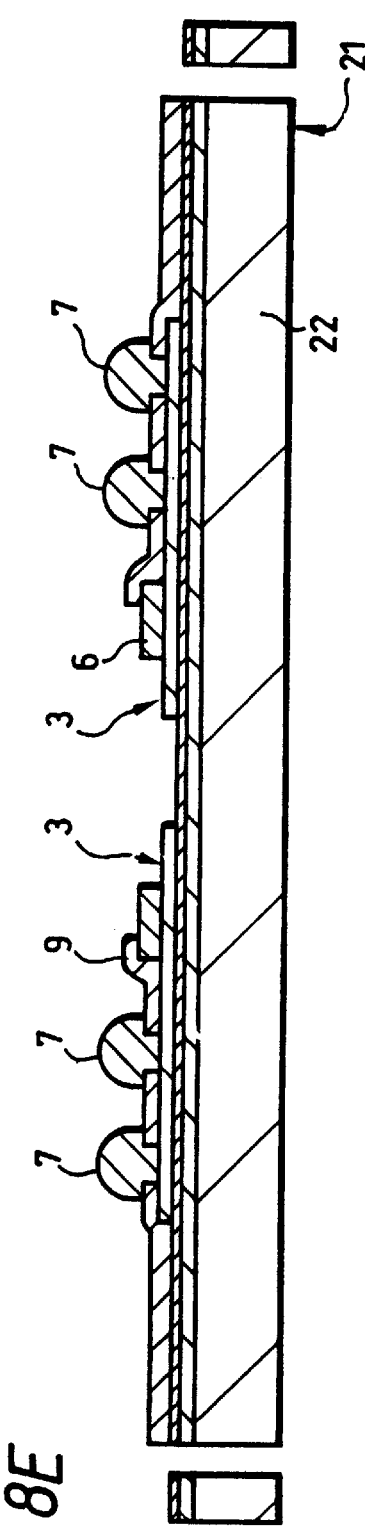
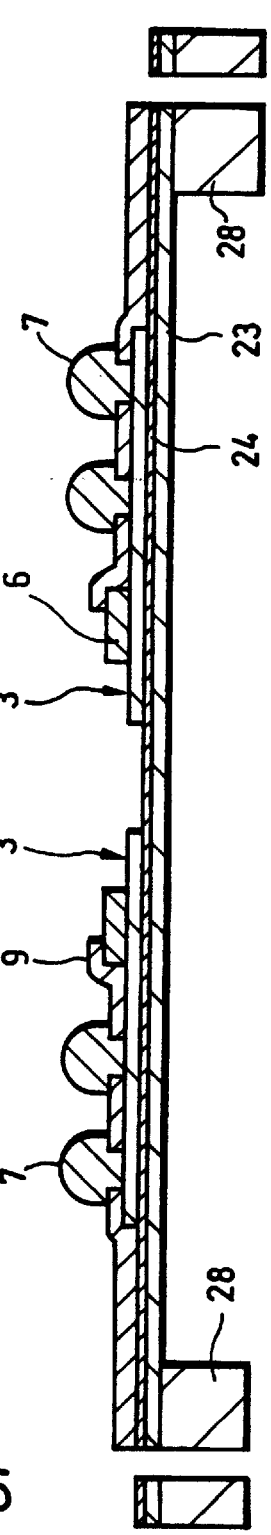
FIG. 8D
FIG. 8E
FIG. 8F

LEAD FRAME AND INTEGRATED CIRCUIT PACKAGE

This application claims benefit of Provisional Application No. 08/714,307 filed Sep. 18, 1996 U.S. Pat. No. 5,886,399.

BACKGROUND OF THE INVENTION

1. Field of the Invention

The present invention relates to a lead frame and an integrated circuit package having a structure with pins of very large number obtained by jointing the above lead frame to a semiconductor chip.

2. Description of the Related Art

FIG. 1 is a cross-sectional view showing a semiconductor device, i.e., an integrated circuit package in which a semiconductor chip can be connected to a circuit board or the like through an organic substrate having a projecting electrode formed of a solder ball or the like.

In FIG. 1, an organic multilayer circuit board a having about two to six layers formed of an organic material is mounted on its surface with a semiconductor tip b. An electrode of the semiconductor tip b and a wiring film c formed on a surface of the organic multilayer circuit board a are connected to each other by wire bonding employing metal wires d or the like.

A solder ball e is provided on a rear surface of the organic multilayer circuit board a and serve as a projecting electrode electrically connected through a through hole i to the wiring film c on the surface of the organic multilayer circuit board a. The solder ball e is faced to the outside through an opening of a solder resist film f. The semiconductor chip b together with the metal wire d are sealed by a sealing resin g.

An integrated circuit package j is formed such that the solder balls e formed on the rear surface of the organic multilayer circuit board a are connected to a circuit board h. Being provided with a large number of solder balls e arranged in a grid fashion, the organic multilayer circuit board a is often called a ball grid array (BGA). The integrated circuit package j employing the organic multilayer circuit board a is called a BGA package.

The BGA package j employs the wire bonding to connect the electrode of the semiconductor chip b with the wiring films c of the organic multilayer circuit board a. Therefore, this arrangement limits reduction of a pitch between electrode pads of the semiconductor chip b and inevitably enhances enlargement of the size of the semiconductor chip b.

The solder balls e in the BGA package j are provided physically. Therefore, when being set to predetermined positions, the solder balls e tend to be displaced, and there is a limit in arrangement of the solder balls e at a finer pitch. Since a large number of solder balls e are arranged in a grid fashion and the BGA package j is formed in a solid fashion by using the organic multilayer circuit board a, costs required for manufacturing the BGA package j is inevitably increased.

When the BGA package j is mounted on the circuit board h, the organic multilayer circuit board a sometimes becomes warped, which leads to the problem of the mounting.

The BGA package j cannot sufficiently radiate generated heat as a package having a large number pins, which prevents a high speed operation of the semiconductor device.

Since the solder balls e are formed in one layer, they cannot have both of satisfactory low-temperature bonding and satisfactory bonding strength.

SUMMARY OF THE INVENTION

In view of such aspects, it is an object of the present invention to provide a lead frame and an integrated circuit package having a structure with pins of a very large number which allow projecting electrodes to be formed in a finer pitch and with higher density and which are excellent in bonding strength and heat radiation of the projecting electrode, in mounting the integrated circuit package on a circuit board and so on, thereby achieving high reliability.

It is another object of the present invention to provide a lead frame and an integrated circuit package which can satisfactory radiate heat generated in a semiconductor chip.

According to a first aspect of the invention, a lead frame includes a plurality of leads held by an insulative holding film and each formed of an inner lead portion for being bonded to a semiconductor chip and an outer lead portion, a pad portion formed at an end portion of the outer lead portion, an insulating film formed in a pattern so as to insulate the adjacent leads, a ground film formed on the pad portion and partially on the insulating film and having a wider area as compared with that of the pad portion, and a projecting electrode formed on the ground film.

According to a second aspect of the present invention, an integrated circuit package includes a semiconductor chip, a member for housing the semiconductor chip, a plurality of leads held by an insulative holding film and each formed of an inner lead portion for being bonded to a semiconductor chip and an outer lead portion, a pad portion formed at an end portion of the outer lead portion, an insulating film formed in a pattern so as to insulate the adjacent leads, a ground film formed on the pad portion and partially on the insulating film and having a wider area as compared with that of the pad portion, and a projecting electrode formed on the ground film.

BRIEF DESCRIPTION OF THE DRAWINGS

FIG. 6 is a cross-sectional view showing the integrated circuit package of the present invention mounted on a circuit board;

FIGS. 7A to 7C are diagrams used to explain processes of manufacturing the integrated circuit package according to the embodiment;

FIGS. 8D to 8F are diagrams used to explain processes of manufacturing the integrated circuit package according to the embodiment;

DESCRIPTION OF THE PREFERRED EMBODIMENTS

According to an integrated circuit package of the present invention, a projecting electrode is formed on each of outer lead portions of a plurality of leads held by an insulative holding film. A semiconductor chip is jointed to inner lead portions of the leads. The projecting electrode is formed on a pad portion opposed to an opening of an insulating film and partially on the insulating film through a ground film having a wider area as compared with that of the pad portion.

According to the integrated circuit package of the present invention, the projecting electrode is formed on each of the outer lead portions of the plurality of leads held by the insulative holding film. The semiconductor chip is jointed to the inner lead portions of the leads. A reinforcement plate is bonded to the outer lead portions through a ductile, elastic adhesive.

According to the integrated circuit package of the present invention, the projecting electrode is formed on each of the outer lead portions of the plurality of leads held by the insulative holding film. The semiconductor chip is jointed to the inner lead portions of the leads. A reinforcement and thermal-radiation plate is bonded to the outer lead portions so as to be bonded to a rear surface of the semiconductor chip.

A method of manufacturing the integrated circuit package of the present invention includes a process of forming the plurality of leads on a surface of a metal base and forming the insulative holding film for holding the respective leads, a process of forming the ground film having a wider area as compared with the pad portion on the pad portion of the lead opposed to the opening of the insulating film and partially over the insulating film and forming the projecting electrode on the ground film by plating, a process of separating the respective lead by selectively removing the metal base, and a process of jointing the inner lead portions of the leads to the semiconductor chip.

A method of manufacturing the integrated circuit package of the present invention includes a process of forming the plurality of leads on the surface of the metal base and forming the insulative holding film for holding the respective leads, a process of forming the projecting electrode on the outer lead portion of the lead, a process of separating the respective lead by selectively removing the metal base, a process of jointing the inner lead portions of the leads to the semiconductor chip, and a process of bonding the reinforcement plate to the outer lead portions through a ductile, elastic adhesive.

A lead frame and an integrated circuit package according to an embodiment of the present invention will hereinafter be described with reference to the accompanying drawings.

Figure 1:
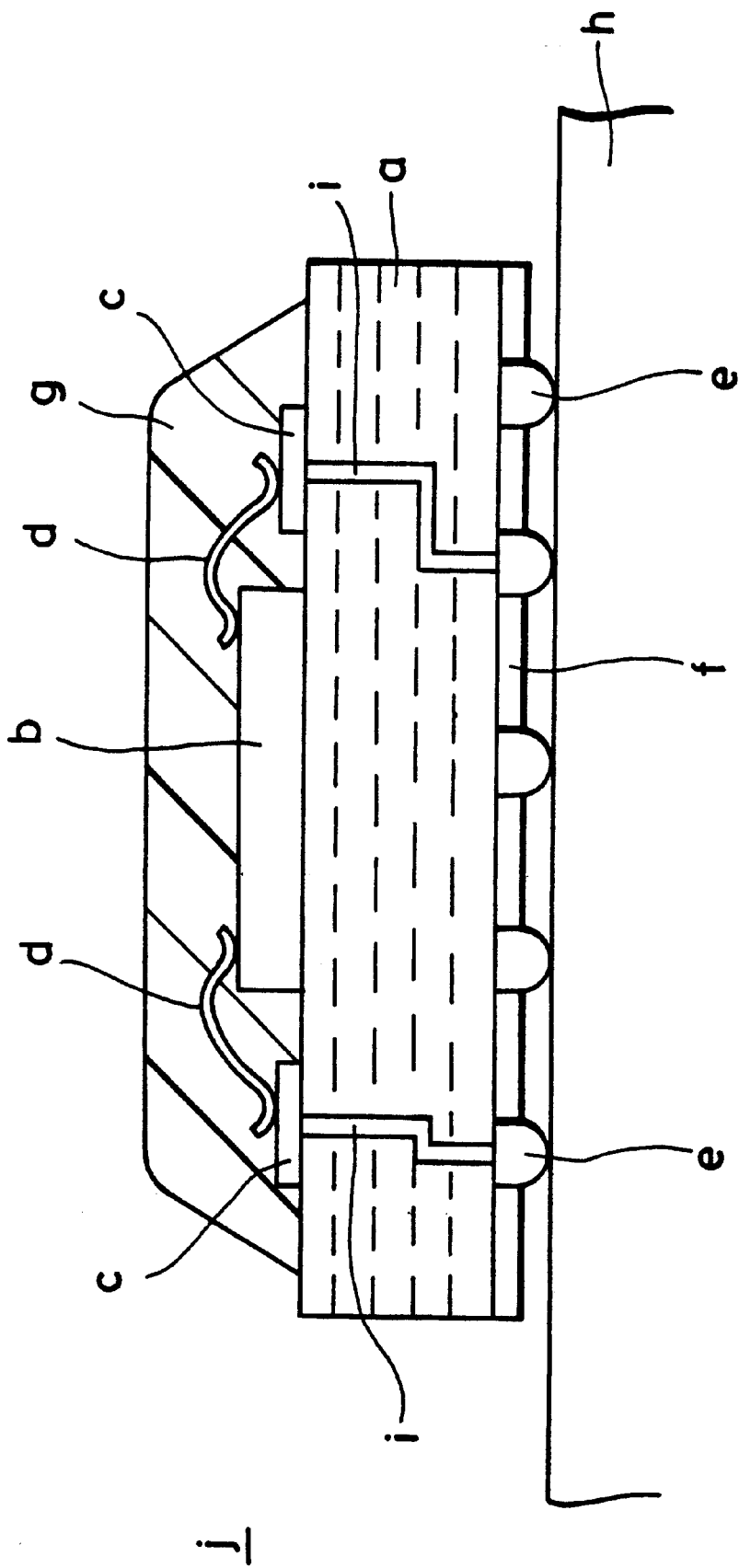
FIG. 1 is a cross-sectional view showing a ball grid array (BGA) integrated-circuit package.
Figure 2:
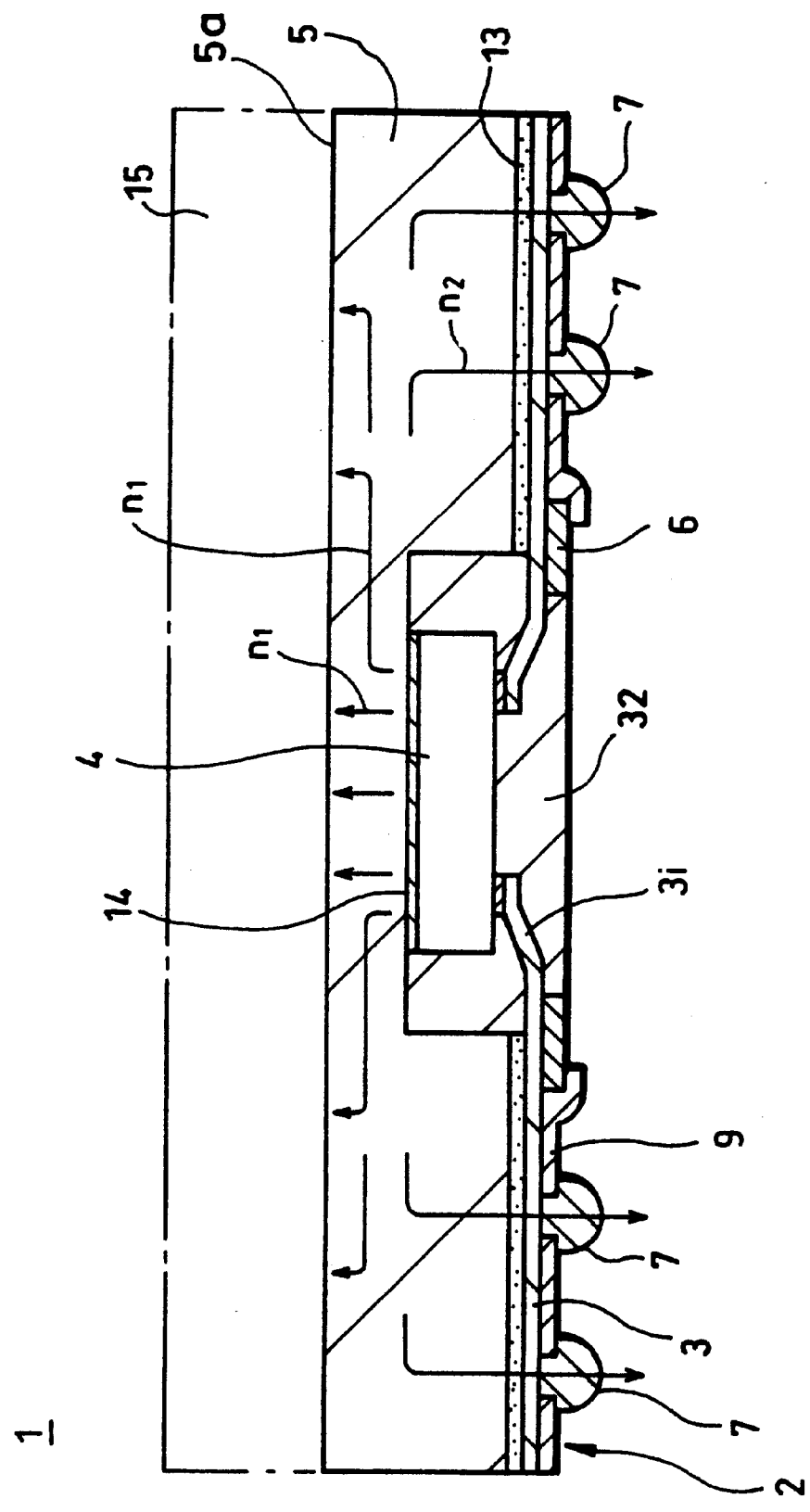
FIG. 2 is a cross-sectional view showing an integrated circuit package according to an embodiment of the present invention.
Figure 3:
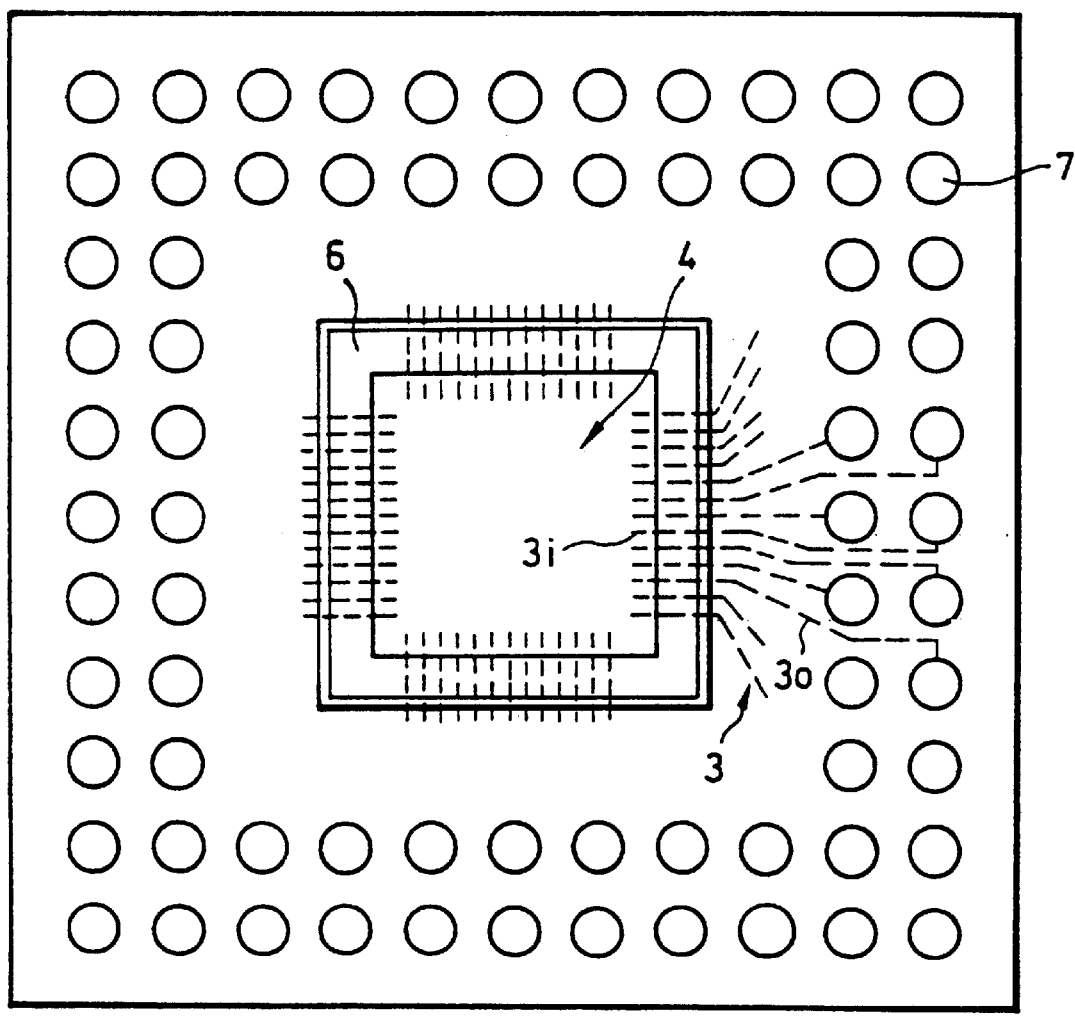
FIG. 3 is a plan view showing the integrated circuit package according to the embodiment of the present invention.

FIGS. 2 and 3 are respectively cross-sectional and plan views showing an integrated circuit package according to the present invention.

An integrated circuit package 1 according to the this embodiment includes a lead frame (strictly speaking, which is a lead body obtained after a joint portion of the lead frame is cut off) 2, a semiconductor chip 4 formed of an LSI or the like jointed to inner lead portions 3i of respective leads 3 of the lead frame 2, and a reinforcement plate 5.

The lead frame 2 has a large number of leads 3 formed by copper electrolytic plating, for example. Projecting electrodes 7 formed of solder balls are formed at end portions of outer lead portions 3o of the leads 3. An insulative holding film formed of a polyimide film, for example, for holding and connecting the respective leads 3 is deposited on portions between inner lead portions 3i and outer lead portions 3o of the leads 3.

Each of the leads 3 is formed so as to have a line width of 20 to 100 μm, for example, a pitch therebetween of 50 to 100 μm, for example, and a thickness of about 30 μm which is about 0.7 to 2.0 times as large as the line width, for example. A large number of leads 3 are formed so as to be extended in all the directions with corresponding to the electrodes formed all the sides of the semiconductor chip 4.

The insulative holding film 6 is formed so as to have a rectangular shape. The inner lead portions 3i of the leads 3 are formed so as to be extended to the inside space of the insulative holding film 6 as shown in FIG. 3. Head end portions of the inner lead portions 3i are jointed to electrodes of the semiconductor chip 4. A solder resist film 9 is formed on an entire surface including the leads 3 except on pad portions 8 (see FIG. 4) where projecting electrodes 7 are to be formed.

When the projecting electrodes 7 are formed, the solder resist film 9 serves to prevent a solder bridge from being generated between the adjacent leads 3 and to insulate the adjacent electrodes and the adjacent leads 3. Specifically, the solder resist film 9 is formed of an insulating film, such as the polyimide film, an epoxy resin film or the like, having a thickness of about 10 to 50 μm, for example. The solder resist film 9 is formed in a predetermined pattern so as to have openings defined at portions where the projecting electrodes 7 are to be formed.

The projecting electrode 7 is formed on the pad portion 8 opposed to the opening of the solder resist film 9 so as to be deposited partially over edge portions of the solder resist film 9. Accordingly, the projecting electrode 7 is formed through the solder resist film 9 over edge portions of the adjacent leads 3 (a so-called lead pattern) (see FIG. 5B).

Figure 5A:
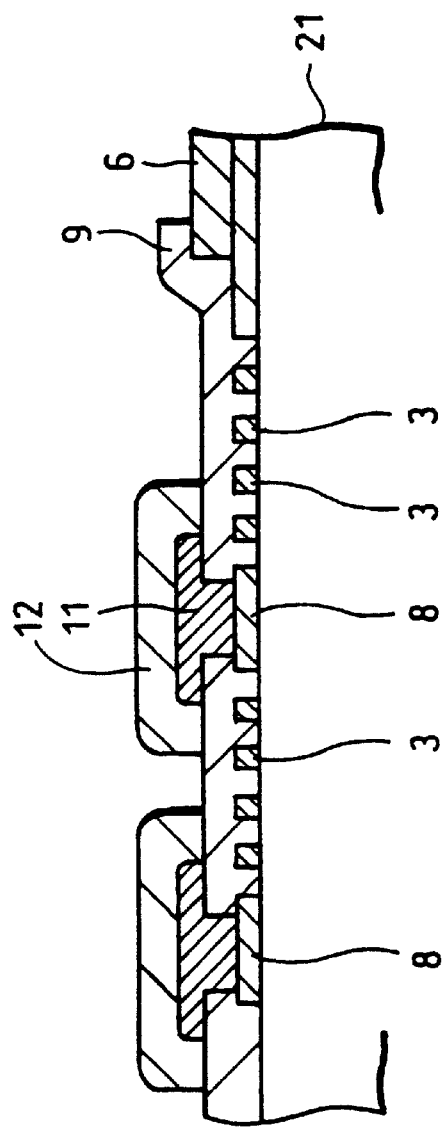
FIGS. 5A and 5B are diagrams used to explain processes of forming a projecting electrode thereof.

When the projecting electrodes 7 are formed, the following method is employed. Specifically, as shown in FIG. 5A, the pad portion 8 exposed at the end portion of the outer lead portion 3o is plated with some suitable metals such as copper (Cu), nickel (Ni), gold (Au) or the like with the solder resist film 9 being employed as a mask, thereby a ground film 11 is formed. A solder portion 12 made of SnPb alloy is deposited on the ground film 11 by electrolytic plating. Then, the solder portion 12 is subjected to the reflowing to thereby be formed in ball-shaped (see FIG. 5B).

The ground film 11 is formed partially over edge portions of the solder resist film 9 so as to have a wider area as compared with that of the pad portion 8. A large number of projecting electrodes 7 are formed in a grid fashion.

The reinforcement plate 5 is formed of a rigid plate made of some metal having a satisfactory heat radiation, i.e., a satisfactory heat conductivity, e.g., an aluminum plate. As shown in FIG. 2, the reinforcement plate 5 has a concave-shaped cross section. The reinforcement plate 5 is bonded to the entire outer lead portions 3o of the leads 3 with a rear surface of the semiconductor chip 4 being bonded through a thermal-conductive paste 14 to a bottom surface of its concave portion. The reinforcement plate 5 is bonded to the leads 3 through a ductile and elastic adhesive 13, e.g., a polyolefin adhesive (a so-called rubber adhesive).

After the reinforcement plate 5 is bonded to the leads 3, the semiconductor chip 4 in its concave portion is sealed by a resin 32 to completely form an integrated circuit package 1.

A heat radiation fin 15 may be jointed to a flat outer surface 5a of the reinforcement plate 5 if necessary.

According to this embodiment, since the reinforcement plate 5 is made of a metal having high heat radiation and is shaped so as to have the concave cross section which allows the semiconductor chip 4 to be bonded directly to the bottom surface of the concave portion, heat generated at the semiconductor chip 4 is conducted to the reinforcement plate 5 and radiated from its outer surface (see FIG. 2 which shows a heat conduction direction $n_1$) or the heat is conducted through the reinforcement plate 5 to the projecting electrodes 7 and radiated from their surfaces (see FIG. 2 shows a head conduction direction $n_2$). Therefore, heat generated in the integrated circuit package having a large number of pins can be radiated satisfactorily and the semiconductor device can be operated at higher speed.

Since the reinforcement plate 5 is formed of a rigid metal plate, the integrated circuit package 1 it self is prevented from being deformed due to warp or the like. Therefore, as shown in FIG. 6, when the integrated circuit package 1 is practically mounted on a circuit board 17 having a circuit pattern 17a, the projecting electrodes 7 can satisfactorily be connected to the circuit pattern 17a of the circuit board 17.

Since the reinforcement plate 5 is formed so as to have the concave-shaped cross section and the flat outer surface 5a, it is possible to easily attach the heat radiation fin 15 to the flat outer surface 5a even when the heat radiation fin 15 is attached if necessary, which leads to more effective heat radiation.

The reinforcement plate 5 is bonded to the leads 3 through the ductile and elastic adhesive 13. As shown in FIG. 6, after the integrated circuit package 1 is mounted on the circuit board 17 practically, even if stress is generated in the integrated circuit package 1 because of difference between thermal expansion $A_1$ of the reinforcement plate 5 formed of the aluminum plate and thermal expansion $A_2$ of the circuit board 17 (usually $A_1 > A_2$) and this stress deteriorates joint between the projecting electrode 7 jointed to the circuit board 17 and the pad portions 8 on the side of the reinforcement plate 5, then the ductile and elastic adhesive 13 absorbs and reduces this stress. Therefore, it is possible to prevent the bond of the projecting electrodes 7 to the pad portions 8 from being deteriorated and hence to improve the reliability of the bond.

Since the projecting electrodes 7 are formed by electrolytic plating, they are formed accurately on the predetermined positions and are prevented from being displaced therefrom.

Figure 5B:
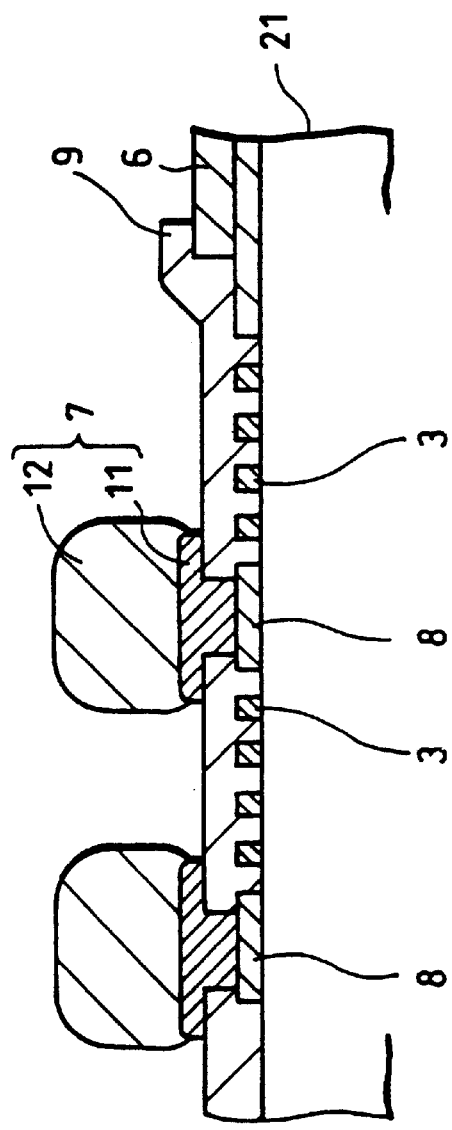

Since the projecting electrodes 7 are formed partially on the edge portions of the solder resist film 9 through the ground film 11, as shown in FIG. 5B, they are formed over a so-called arrangement pattern of the leads 3. This arrangement can reduce the pitch between the projecting electrodes 7 more and allows the integrated circuit package 1 having a large number of pins with high density to be provided.

A ground for the solder ball 12 as the projecting electrode 7 is formed of the ground film 11 by copper plating, thereby being made ductile and made so as to have the bonding strength. Therefore, it is possible to prevent deterioration in the bond of the integrated circuit package 1 to the circuit board 17 resulting from the stress applied to the projecting electrodes 7 after the integrated circuit package 1 is practically mounted on the circuit board 17.

Thus, it is possible to obtain the integrated circuit package 1 having higher reliability, a larger number of pins, and a smaller size.

FIGS. 7A to 7C, 8D to 8F and 9G to 9I are diagrams showing the processes of manufacturing the integrated circuit package 1 according to the present invention.

In this embodiment, as shown in FIG. 7A, a metal base 21 is prepared initially. The metal base 21 is a laminated plate having a trilayer structure formed of a thin plate 22 (hereinafter referred to as a copper substrate 22) made of copper or copper alloy with its thickness of about 150 $\mu$m, for example, an aluminum film 23 formed on a surface of the copper substrate 22 with its thickness of about 3 $\mu$m, for example, and a thin copper film 24 with its thickness of about 2 $\mu$m, for example, formed on a surface of the aluminum film 23.

Figure 9G:
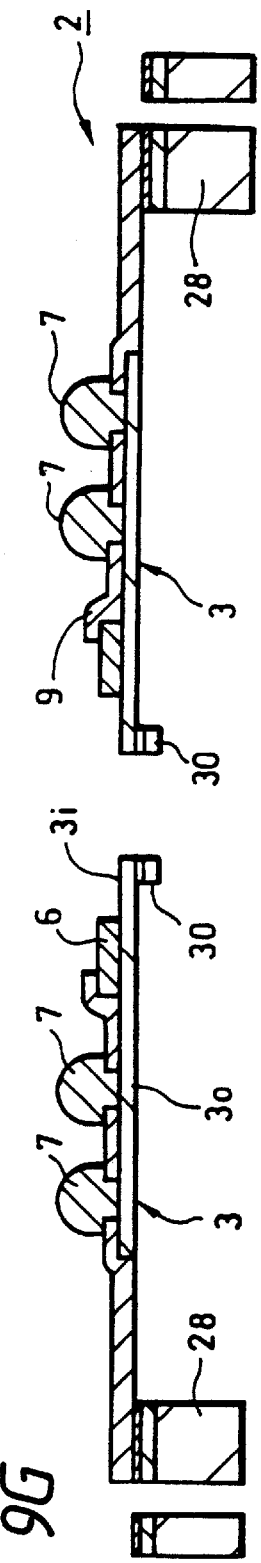
FIGS. 9G to 9I are diagrams used to explain processes of manufacturing the integrated circuit package according to the embodiment.

The aluminum film 23 serves as an etching stopper film which prevents a surface side of the metal base 21 from being etched when the copper substrate 22 is etched, and also serves as a bump 30 formed at a head end of an inner lead portion 3i of a lead 3 (see FIG. 9G). The thin copper film 24 serves as a ground used upon copper plating for forming the leads 3. The thin copper film 24 facilitates a satisfactory copper plating.

The metal base 21 will not serve as the lead 3 by itself and hence will finally becomes unnecessary. However, the metal base 21 is transiently required as a substrate when the very thin lead 3 is formed, and as a lead frame thereafter, and hence serves as a so-called lead forming substrate.

Figure 11:
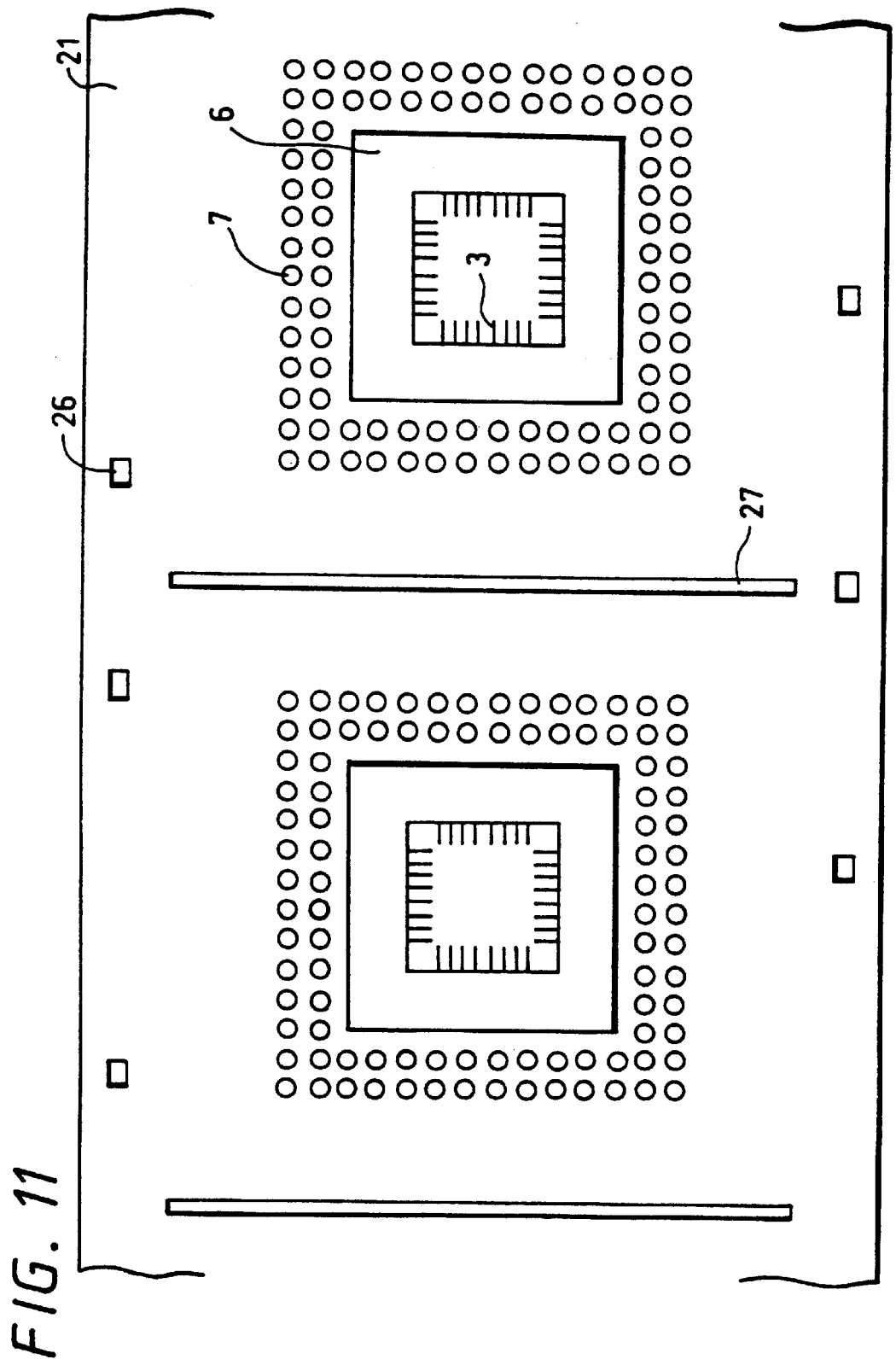
FIG. 11 is a plan view of the integrated circuit package mounted on the circuit board, used to explain the process shown in FIG. 8E.

As shown in FIGS. 7B and 11, a large number of leads made of copper, i.e., a large number of leads 3 integrally having pad portions 8 used for forming projecting electrodes (i.e., solder balls) at their head ends are formed by selective plating on a surface of the metal base 21, i.e., on a surface of the thin copper film 24.

The leads 3 of a large number are formed so as to be extended in all the directions with corresponding to the projecting electrodes formed on all the sides of the semiconductor chip 4. The pad portions 8 formed on the head ends of the leads 3 are formed on the outer periphery of the leads 3 in a grid fashion.

Figure 4:
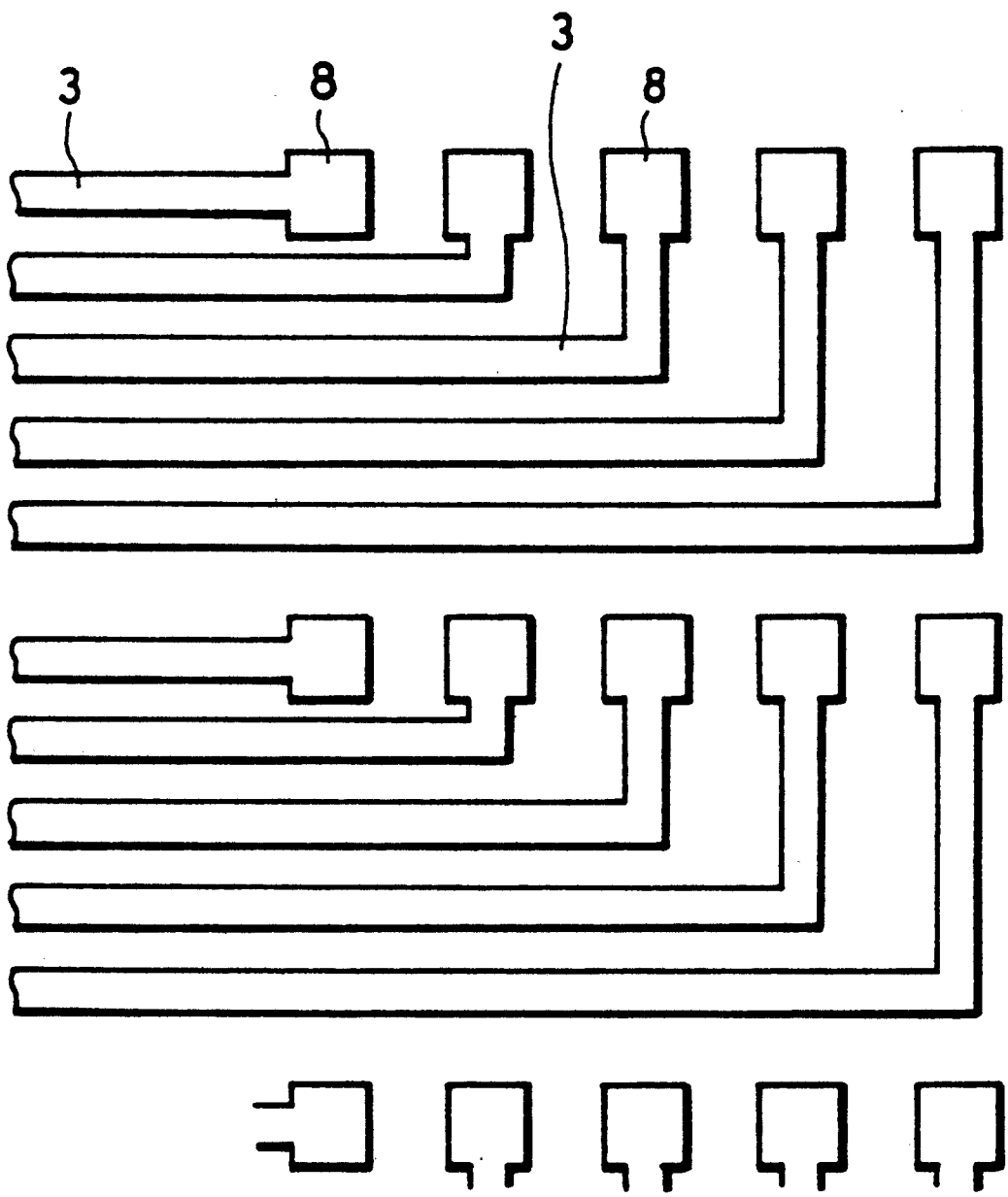
FIG. 4 is a diagram showing a lead and a pad portion thereof.

FIGS. 7A to 7C show the pad portions 8 (not shown) arranged in only two lines for simplification, but FIG. 4 shows the pad portions 8 arranged in five lines as practically arranged.

In the above selective plating, a surface of the thin copper film 24 is selectively covered with a resist film or the like and electrolytic plating is carried out with the resist film being employed as a mask therefor. Thus, when copper is selectively plated on the metal base 21 by electrolytic plating, it is possible to form the leads 3 in a fine pattern while making the film quality satisfactory. In this case, the leads 6 are formed at a pitch of 100 $\mu$m, for example.

As shown in FIG. 7C, apertures 26 (see FIG. 11) for facilitating fabrication of the integrated circuit package and slits 27 used for determining a size of the lead frame with respect to every semiconductor chip are formed at side edge portions of the metal base 21 by selective etching.

As shown in FIG. 8D, on the surface of the metal base 21 where the leads 3 are formed, an insulative holding film for finally holding the respective leads 3, e.g., a polyimide film 6 is laminated over positions between inner lead portions 3i and outer lead portions 3o of the respective leads 3. The polyimide film 6 is formed so as to have a shape of a rectangular frame as shown in FIG. 3.

A solder resist film 9 is deposited entirely except on the inner lead portions 3i and the pad portions 8 of the outer lead portions $3_o$.

As shown in FIGS. 8E and 11, projecting electrodes 7 formed of solder balls are formed by plating on the pad portions 8 at the head end of the outer lead portions $3_o$ of the respective leads 3.

As shown in FIG. 5A, metal ground films 11 made of, for example, copper (Cu), nickel (Ni), gold (Au) or the like are formed on the copper pad portions 8 by electrolytic plating. Solder portions 12 made of SnPb alloy (its composition ratio of Sn:Pb is 1:9, 6:4 or the like) are formed on the ground films 11 by plating. Then, the solder portions 12 are subjected to reflowing, thereby being formed so as to be ball-shaped as shown in FIG. 5B. Thus, the projecting electrodes 7 are formed.

Each of the ground films 11 is formed on not only the pad portion 8 and but also on both-side edge portions of the solder resist film 9, i.e., formed so as to have a wider area as compared with that of the pad portion 8. The ground film 11 serves as a substantial pad portion used for forming the projecting electrode 7, i.e., the solder ball 12.

The ground film 11 may be made of SnPb alloy (its composition ratio of Sn:Pb is 1:9, 6:4 or the like), the solder portion 12 having the same composition being formed thereon to obtain the solder ball. However, it is better to make the ground film 11 of copper, nickel or the like in consideration of the bond thereof to the pad portion 8.

As shown in FIG. 8F, the copper substrate 22 of the metal base 21 is removed by selective etching or stopper except its outer peripheral joint portion 28. When this etching is carried out, the aluminum film 23 serves as the etching barrier and allows only the copper substrate 22 to be etched away.

Then, as shown in FIG. 9G, the aluminum film 23 and the thin copper film 24 of the metal base 21 are removed by selective etching to separate the respective leads 3. When the aluminum film 23 and the thin copper film 24 are etched, the selective etching is carried out so that bumps 30 made of one aluminum film 23 should be left at the head ends of the inner lead portions 3i.

In this state, the outer peripheral joint portions 28 formed of the metal base 21 are held by the solder resist film 9. Thus, a lead frame 2 having a large number of leads 3 and the projecting electrodes 7 formed on the ends of the outer lead portions $3_o$ of the leads 3 is formed.

Figure 9H:
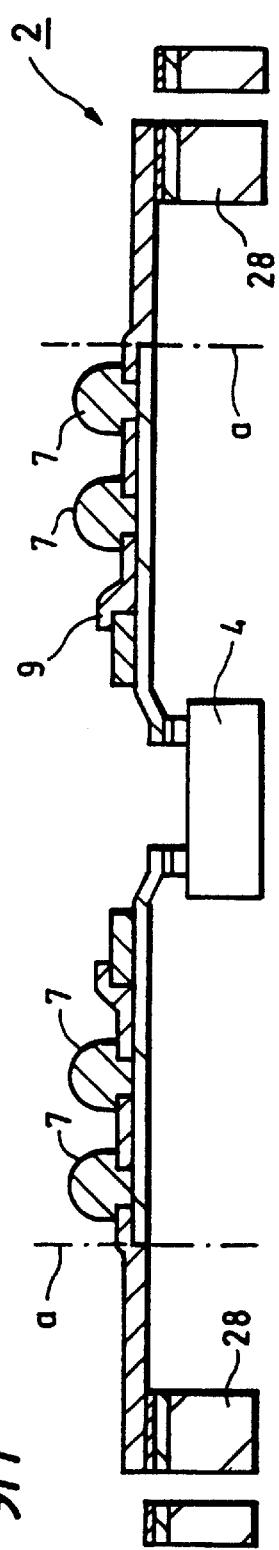

As shown in FIG. 9H, a semiconductor chip 4 is jointed to the lead frame 2. Specifically, the bump 30 at the head of each of the inner lead portions 3i is connected directly to an electrode of the semiconductor chip 4.

Figure 9I:
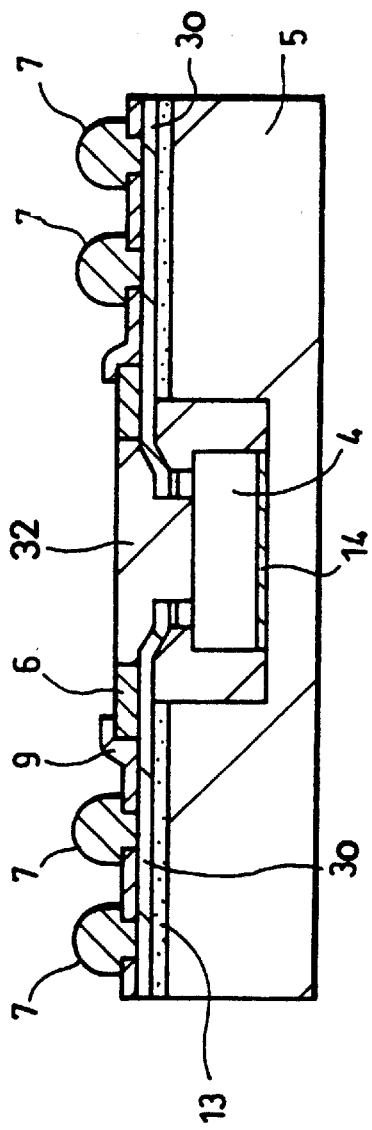

As shown in FIG. 9I, a reinforcement plate 5 having the concave-shaped cross section allowing the semiconductor chip 4 to be housed therein, a rigid aluminum plate in this embodiment is bonded to a rear surface of the lead frame 2 corresponding to the outer lead portion $3_o$ through the adhesive 13 so as to surround the semiconductor chip 4.

It is desirable to employ as the adhesive 13 a ductile, elastic adhesive, e.g., the polyolefin adhesive having satisfactory heat radiation.

The semiconductor chip 4 is bonded at its rear surface directly to the bottom surface of the concave portion of the reinforcement plate 15 through the thermal conductive paste 14.

After the semiconductor chip 4 is sealed by the resin 32, the lead frame 2 is cut at a position a shown by a chain line in FIG. 9H so that the joint portion 28 of the lead frame 26 should be removed.

Thus, the integrated circuit package 1 as shown in FIGS. 2, 3 is obtained which has a structure of pins of a very large number where a large number of projecting electrodes 7 are formed in a grid fashion and which is reinforced by the reinforcement plate 5 having a satisfactory thermal radiation.

According to the method of manufacturing the integrated circuit package, when the projecting electrodes 7 are formed, the ground is formed of the ground film 11 made by copper plating or the like, thereby being made ductile and having bonding strength. As a result, the bond at a surface between the ground film 11 and the solder ball 12 formed thereon can be improved, and the solder ball 12 can be formed by the low-temperature reflowing.

Since the projecting electrodes 7 are formed by electrolytic plating, it is possible to form the projecting electrodes 7 accurately at the predetermined position without being displaced.

Since the ground film 11 is formed so as to have a wider area as compared with that of the pad portion 8 and the solder ball 12 is formed thereon, the ground film 11 serves as a substantial pad portion, which consequently improves the bonding strength between the solder ball 12 and the substantial pad portion. Even if there are many arrangement lines of the leads 3 between the pad portions 8, it is possible to form the projecting electrodes 7 at a finer pitch.

Since the reinforcement plate 5 are bonded to the leads 3 through the ductile and elastic adhesive 13, the ductile and elastic adhesive 13 can absorb the stress resulting from the difference in thermal expansion between the reinforcement plate 5 and the circuit board 17 after the integrated circuit package 1 is practically mounted on the circuit board 17, which leads to the higher reliability of the integrated circuit package 1.

Figure 10:
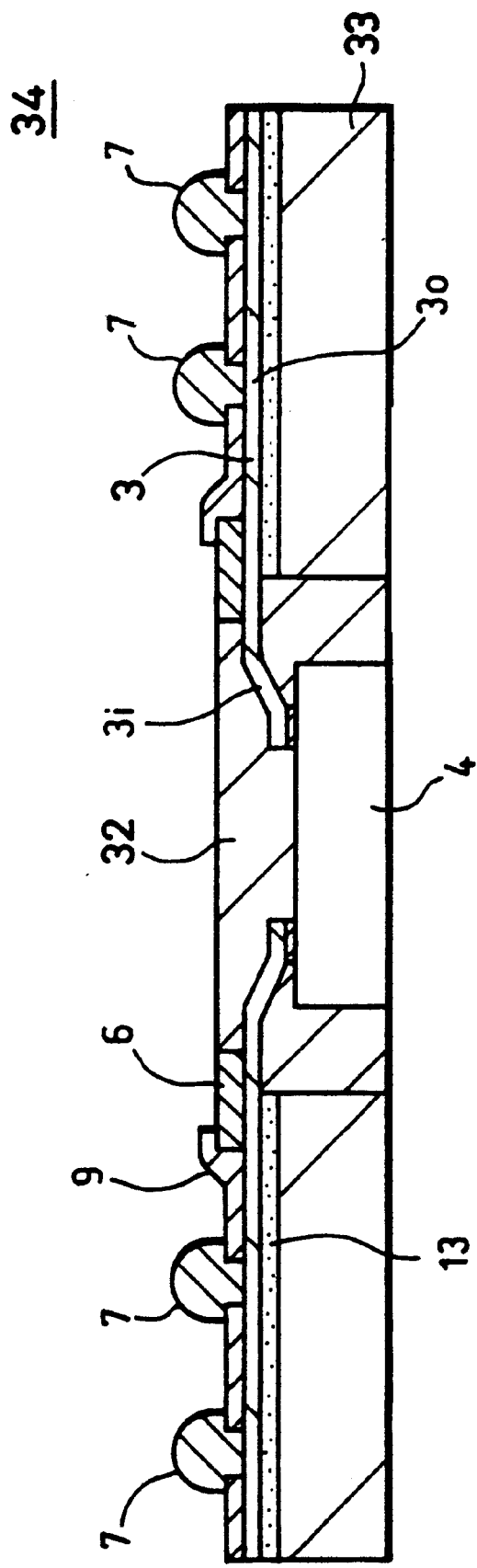
FIG. 10 is a cross-sectional view showing an integrated circuit package according to another embodiment of the present invention.

FIG. 10 is a cross-sectional view showing an integrated circuit package according to another embodiment of the present invention.

In stead of employing the reinforcement plate 5 having the concave-shaped cross section shown in FIG. 2, an integrated circuit package 34 employs a frame-shaped reinforcement plate 33 made of some suitable metal, such as aluminum or the like, having a satisfactory thermal radiation. The frame-shaped reinforcement plate 33 is bonded to the lead frame 2. The semiconductor chip 4 is sealed by the resin 32 such that a rear surface of the reinforcement plate 33 and a rear surface of the semiconductor chip 4 are aligned at one level and that the rear surface of the semiconductor chip 4 is exposed to the outside.

Other arrangements of the integrated circuit package 34 are similar to that of the integrated circuit package 1 shown in FIG. 2. Therefore, like parts and portions corresponding to those shown in FIG. 2 are marked with the same reference numerals and hence need not to be described in detail. The integrated circuit package 34 can also be manufactured similarly to the method described with reference to FIGS. 7A to 7C, 8D to 8F and 9G to 9I.

According to the integrated circuit package 34, since the rear surface of the semiconductor chip 4 is exposed to the outside, heat generated in the semiconductor chip 4 is satisfactorily radiated, which provides the integrated circuit package with excellent heat radiation. Since the surface of the integrated circuit package 34 on the opposite side of the projecting electrodes 7 is formed as a flat surface from the reinforcement plate 33 and the semiconductor chip 4, it is possible to easily attach the heat radiation fin on the surface of the semiconductor chip 4 if necessary. The integrated circuit package 34 achieves the same effects as those of the integrated circuit package 1 shown in FIG. 2.

According to the present invention, since the projecting electrode 7 having a wider area as compared with that of the pad portion 8 is formed on the pad portion 8 of the lead 3 and partially on the solder resist film 9, it is possible to form the projecting portions at a finer pitch and consequently it is possible to obtain the integrated circuit package having a structure with pins of very large number.

Since the reinforcement plate 5 or 33 is bonded to the outer lead portion 3o through the ductile and elastic adhesive 13, the ductile and elastic adhesive 13 serves to reduce the stress of the integrated circuit package 1 or 34 resulting from the difference in thermal expansion between the reinforcement plate 5 or 33 and the circuit board 17 after the integrated circuit package 1 or 34 is mounted practically on the circuit board 17. Therefore, it is possible to reduce the stress and it is possible to prevent the deterioration of the bond of the projecting electrode 7 to the pad portion. Specifically, it is possible to improve the reliability in the bond of the projecting electrode.

When the reinforcement plate 5 serving also as a heat radiation plate is bonded to the outer lead portion 3o so that the rear surface of the semiconductor chip 4 should be bonded to the reinforcement plate 5, the heat generated in the semiconductor chip 4 is satisfactorily radiated from the reinforcement plate 5 also serving as the heat radiation plate. Specifically, it is possible to provide the integrated circuit package with the pins of the very large number having high heat radiation which allows the semiconductor device to be operated at higher speed.

According to the present invention, it is possible to manufacture the integrated circuit package having the structure with the pins of the very large number by employing only the single-layer leads, which can simplify the processes of manufacturing the integrated circuit package. Since the projecting electrode 7 is formed on the pad portion 8 through the ground film 11 having a wider area, it is possible to improve the bonding strength at the surface between the projecting electrode 7 and the ground film 11. Since the projecting electrodes 7 are formed by plating, it is possible to form the projecting electrodes 7 accurately at the predetermined positions, and moreover to form the projecting electrodes 7 at a finer pitch.

Since the reinforcement plate 5 or 33 is bonded to the outer lead portion 30 through the ductile, elastic adhesive 13, it is possible to reduce the stress of the integrated circuit package 1 or 34 resulting from the difference in thermal expansion between the reinforcement plate 5 or 33 and the circuit board 17 after the integrated circuit package 1 or 34 is practically mounted on the circuit board 17.

According to the present invention, since the heat generated from the semiconductor chip 4 is radiated directly from the reinforcement plate 5 or 33 of the integrated circuit package 1 or 34, it is possible to satisfactorily radiate the heat generated in the integrated circuit package 1 or 34 having the structure with the pins of the very large number. Therefore, it is possible to provide the integrated circuit package of this kind with high reliability.

Having described preferred embodiments of the present invention with reference to the accompanying drawings, it is to be understood that the present invention is not limited to the above-mentioned embodiments and that various changes and modifications can be effected therein by one skilled in the art without departing from the spirit or scope of the present invention as defined in the appended claims.

What is claimed is:

1. A method of manufacturing a semiconductor chip package structure comprising the steps of:
    forming a plurality of leads, said leads having an inner lead portion and an outer lead portion, wherein the outer lead portion includes a pad portion;
    connecting an inner lead portion of the leads to a semiconductor chip;
    forming an insulating film on the leads and between horizontally adjacent leads;
    forming a ground film on the pad portions of the leads and partially on the insulating film, and wherein the ground film formed on the pad portions has a larger surface area than the corresponding pad portions.

2. The method of claim 1, wherein the step of forming a ground film comprises forming a layer of copper, nickel, or gold.

3. The method of claim 1, further comprising a step of forming a projecting electrode on the ground film layer.

4. The method of claim 3, wherein the step of forming the projecting electrode comprises subjecting the ground film and solder formed on said ground film to a reflowing process.

5. The method of claim 3, wherein said step of forming the projecting electrode comprises applying solder to a surface of the ground film.

6. The method of claim 1, further comprising a step of providing a housing member that surrounds at least four sides of the semiconductor chip.

7. The method of claim 5, further comprising a step of bonding the housing member to the outer lead portions with an adhesive.

8. The method of claim 5, further comprising a step of attaching a radiation fin to an outer surface of said housing member.

9. A method of manufacturing an electronic device comprising the steps of:
    forming a semiconductor integrated circuit package, said step of forming an integrated circuit package comprising
        forming a plurality of leads, said leads having an inner lead portion and an outer lead portion, wherein the outer lead portion includes a pad portion;
        connecting an inner lead portion of the leads to a semiconductor chip;
        forming an insulating film on the leads and between horizontally adjacent leads;
        forming a ground film on the pad portions of the leads and partially on the insulating film, wherein the ground film formed on the pad portions has a larger surface area than the corresponding pad portions;
        forming a projecting electrode on the pad portions; and
        connecting the projecting electrodes formed on the pad portions to corresponding electrical conductors on a printed circuit board.

10. The method of claim 9, wherein the step of forming a ground film comprises forming a layer of copper, nickel, or gold.

11. The method of claim 9, wherein the step of forming the projecting electrode comprises subjecting the ground film and solder formed on said ground film to a reflowing process.

12. The method of claim 9, wherein said step of forming the projecting electrode comprises applying solder to a surface of the ground film.

13. The method of claim 9, further comprising a step of providing a housing member that surrounds at least four sides of the semiconductor chip.

14. The method of claim 13, further comprising a step of bonding the housing member to the outer lead portions with an adhesive.

15. The method of claim 13, further comprising a step of attaching a radiation fin to an outer surface of said housing member.

* * * * *